United States Patent
Yoshikawa et al.

(10) Patent No.: US 10,734,225 B2
(45) Date of Patent: Aug. 4, 2020

(54) NITRIDE SEMICONDUCTOR SUBSTRATE AND METHOD FOR MANUFACTURING SAME

(71) Applicant: ASAHI KASEI KABUSHIKI KAISHA, Tokyo (JP)

(72) Inventors: Akira Yoshikawa, Tokyo (JP); Tomohiro Morishita, Tokyo (JP); Motoaki Iwaya, Nagoya (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/347,928

(22) PCT Filed: Nov. 8, 2017

(86) PCT No.: PCT/JP2017/040313
§ 371 (c)(1),
(2) Date: May 7, 2019

(87) PCT Pub. No.: WO2018/088441
PCT Pub. Date: May 17, 2018

(65) Prior Publication Data
US 2019/0355571 A1 Nov. 21, 2019

(30) Foreign Application Priority Data

Nov. 8, 2016 (JP) ................. 2016-218299

(51) Int. Cl.
*H01L 27/15* (2006.01)
*H01L 21/02* (2006.01)
(Continued)

(52) U.S. Cl.
CPC ........ *H01L 21/0262* (2013.01); *H01L 31/036* (2013.01); *H01L 31/03044* (2013.01);
(Continued)

(58) Field of Classification Search
CPC ..... H01L 21/0262; H01L 33/32; H01L 33/16; H01L 31/007; H01L 31/036; H01L 31/1856
See application file for complete search history.

(56) References Cited

U.S. PATENT DOCUMENTS

2009/0272993 A1* 11/2009 Cheong ................... H01L 33/10
257/94
2010/0207097 A1* 8/2010 Oh .......................... H01L 33/18
257/13
(Continued)

FOREIGN PATENT DOCUMENTS

JP 2009-190960 A 8/2009
JP 2010-267759 A 11/2010
(Continued)

OTHER PUBLICATIONS

International Preliminary Report on Patentability issued in corresponding International Patent Application No. PCT/JP2017/040313 dated Nov. 8, 2017, 7 pages.
(Continued)

*Primary Examiner* — Phuc T Dang
(74) *Attorney, Agent, or Firm* — Morgan, Lewis & Bockius LLP

(57) ABSTRACT

A nitride semiconductor substrate includes a sapphire substrate and a nitride semiconductor layer formed thereon and containing a group III element including Al and nitrogen as a main component. A surface of the sapphire substrate where the nitride semiconductor layer is formed includes recesses having a maximum opening size of from 2 nm to 60 nm in an amount of from $1\times10^9$ pieces to $1\times10^{11}$ pieces per $cm^2$. The recesses and surfaces immediately above the recesses form spaces. Of a surface of the nitride semiconductor layer on the sapphire substrate side, a height difference ΔH between a surface immediately above of each recess and a
(Continued)

surface in contact with a flat surface is 10 nm or less. A portion of the nitride semiconductor layer above each recess has a crystalline structure produced by growth along a polar plane of the group III element.

20 Claims, 1 Drawing Sheet

(51) Int. Cl.
　　*H01L 31/0304*　　(2006.01)
　　*H01L 31/036*　　(2006.01)
　　*H01L 31/18*　　(2006.01)
　　*H01L 33/00*　　(2010.01)
　　*H01L 33/16*　　(2010.01)
　　*H01L 33/32*　　(2010.01)
　　*H01L 31/167*　　(2006.01)

(52) U.S. Cl.
　　CPC ........ *H01L 31/1856* (2013.01); *H01L 33/007* (2013.01); *H01L 33/16* (2013.01); *H01L 33/32* (2013.01); *H01L 31/167* (2013.01)

(56) References Cited

U.S. PATENT DOCUMENTS

| | | |
|---|---|---|
| 2011/0094438 A1 | 4/2011 | Koukitu et al. |
| 2013/0089973 A1* | 4/2013 | Komada .............. H01S 5/0207 438/479 |
| 2016/0141447 A1 | 5/2016 | Michiue |
| 2017/0047482 A1 | 2/2017 | Michiue |
| 2017/0110630 A1* | 4/2017 | Kawakami ........ H01L 21/02516 |
| 2018/0090642 A1 | 3/2018 | Michiue |
| 2019/0081209 A1 | 3/2019 | Michiue |

FOREIGN PATENT DOCUMENTS

| | | |
|---|---|---|
| JP | 2015-168594 A | 9/2015 |
| JP | 2016-064928 A | 4/2016 |
| JP | 2016-100363 A | 5/2016 |

OTHER PUBLICATIONS

Kumagai et al., "Investigation of void formation beneath thin AlN layers by decomposition of sapphire substrates for self-separation of thick AlN layers grown by HVPE," Journal of Crystal Growth, Apr. 9, 2010, vol. 312, pp. 2530-2536.

Hao et al., "Formation chemistry of high-density nanocraters on the surface of sapphire substrates with an in situ etching and growth mechanism of device-quality GaN films on the etched substrates," Applied Physics Letters, vol. 84, No. 20, May 17, 2004, pp. 4041-4043.

Nishio et al., "Annealing in N2-CO of AlN buffer layers on sapphire and high temperature growth of AlN layers by MOVPE," IEICE technical report. Lasers and quantum electronics, Nov. 21, 2013, vol. 113, No. 331, pp. 75-78 (see English abstract).

Li et al., "Growth of high-quality AlN layers on sapphire substrates at relatively low temperatures by metalorganic chemical vapor deposition," Physica Status Solidi B, vol. 252, No. 5, Jan. 21, 2015, pp. 1089-1095.

Yoshikawa et al., "High-quality AlN film grown on a nanosized concave-convex surface sapphire substrate by metalorganic vapor phase epitaxy," Applied Physics Letters, Oct. 16, 2017, vol. 111, No. 16, 162102-1 to 162102-4.

International Search Report issued in corresponding International Patent Application No. PCT/JP2017/040313 dated Jan. 16, 2018.

* cited by examiner

NITRIDE SEMICONDUCTOR SUBSTRATE AND METHOD FOR MANUFACTURING SAME

TECHNICAL FIELD

The present invention relates to a nitride semiconductor substrate including a nitride semiconductor layer formed on a sapphire substrate.

BACKGROUND ART

As a method for forming a nitride semiconductor layer on a sapphire substrate, a method disclosed in PTL 1 is known.

The method disclosed in PTL 1 is a method for growing a nitride semiconductor by a molecular beam epitaxy (MBE) method, and includes a step of forming a buffer layer on a substrate, a step of forming a first nitride crystal on the buffer layer at a first temperature, and a step of forming a first nitride crystal on the first nitride crystal at a second temperature higher than the first temperature.

The method disclosed in PTL 1 is intended to grow a nitride semiconductor with low crystal defect density on a sapphire substrate or the like by the MBE method having advantages, such as low residual impurity concentration.

CITATION LIST

Patent Literature

PTL 1: JP 2015-168594 A

SUMMARY OF INVENTION

Technical Problem

No sufficient investigation has been conducted to date regarding a technology for forming a nitride semiconductor layer configured to achieve a balance between crystallinity and surface flatness on a sapphire substrate.

It is an object of the present invention to provide a substrate including a nitride semiconductor layer excellent in crystallinity and surface flatness formed on a sapphire substrate.

Solution to Problem

To achieve the above object, a first aspect of the present invention provides a nitride semiconductor substrate including the following structures (1) to (5):

(1) the nitride semiconductor substrate is a nitride semiconductor substrate including a sapphire substrate and a nitride semiconductor layer formed on the sapphire substrate and containing a group III element including Al and nitrogen as a main component;

(2) a surface of the sapphire substrate where the nitride semiconductor layer is formed includes recesses having a maximum opening size of from 2 nm to 60 nm in an amount of from $1\times10^9$ pieces to $1\times10^{11}$ pieces per $cm^2$;

(3) a space is formed by each of the recesses and a surface of the nitride semiconductor layer immediately above each recess;

(4) of a surface of the nitride semiconductor layer on the sapphire substrate side, a height difference between the surface immediately above the each recess and a surface in contact with a flat surface is 10 nm or less; and (5) a portion of the nitride semiconductor layer above the each recess has a crystalline structure produced by growth along a polar plane of the group III element including Al.

A second aspect of the present invention provides a method for manufacturing a nitride semiconductor substrate including first to third steps described in the following (11) to (13):

(11) a first step of forming, on a sapphire substrate, a recess forming film having a thickness of from 0.1 nm to 10 nm and containing, as a main component, a nitride semiconductor including a group III element including Al and nitrogen;

(12) a second step of forming through holes in the recess forming film by annealing the sapphire substrate after the first step at a temperature of from 1100° C. to 1350° C. to form recesses having a maximum opening size of from 2 nm to 60 nm in an amount of from $3\times10^9$ pieces to $1\times10^{11}$ pieces per $cm^2$ on a surface of the sapphire substrate where the recess forming film is formed; and

(13) a third step of forming a nitride semiconductor layer containing a group III element including Al and nitrogen as a main component on the recess forming film of the sapphire substrate after the second step.

Advantageous Effects of Invention

According to the aspects of the present invention, there can be provided a nitride semiconductor substrate where a nitride semiconductor layer excellent in crystallinity and surface flatness is formed on a sapphire substrate.

DESCRIPTION OF EMBODIMENTS

Figure 1:
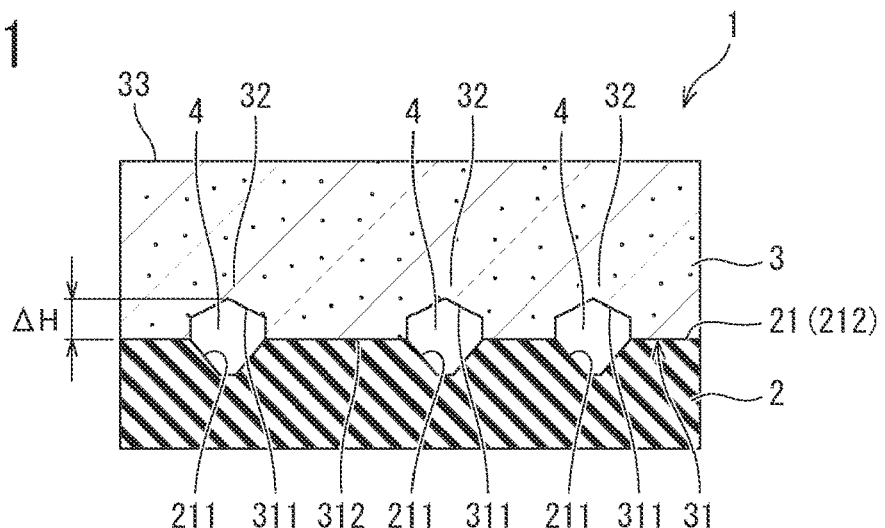
FIG. 1 is a cross-sectional view illustrating a nitride semiconductor substrate of an embodiment.

[Description of Aspects of the Present Invention]

In conventional ordinary methods, when a nitride semiconductor layer is formed on a sapphire substrate with recesses formed thereon, portions of the nitride semiconductor layer above the recesses tend to have a crystalline structure produced by growth along a polar plane of nitrogen, which is a group V element. Additionally, of a surface of the nitride semiconductor layer on the sapphire substrate side, a height difference between a surface immediately above each of the recesses and a surface in contact with a flat surface tends to be larger than 10 nm. In any case, the surface of the nitride semiconductor layer tends to have no favorable flatness. In other words, the conventional technologies have difficulty in achieving a balance between crystallinity and surface flatness.

By contrast, according to the method of the second aspect of the present invention, the first and second steps form recesses having a maximum opening size of from 2 nm to 60 nm in an amount of from $3\times10^9$ pieces to $1\times10^{11}$ pieces per $cm^2$ on a main surface (a surface where a nitride semiconductor layer is to be formed at the third step) of the sapphire substrate. As a result, when forming the nitride semiconductor layer at the third step, dislocations are concentrated at the portions formed an initial stage, thus improving crystallinity of portions formed after that.

Additionally, at the first step, the recess forming film having the above structure is formed on the sapphire substrate, whereby, at the second step, the recesses having the above structure can be formed, and, at the third step, the nitride semiconductor layer formed at the initial stage can be configured to satisfy the following structures (a) and (b):

(a) of a surface of the nitride semiconductor layer on the sapphire substrate side, a height difference between the surface immediately above each of the recesses and a surface in contact with a flat surface is 10 nm or less; and (b) a portion of the nitride semiconductor layer above each recess has a crystalline structure produced by growth along a polar plane of the group III element including Al.

As a result, portions of the nitride semiconductor layer formed after the initial stage have a low rate of island-shaped growth, so that the third step, there is formed a nitride semiconductor layer excellent in flatness of a surface (a surface on a side opposite to the sapphire substrate).

In addition, the obtained nitride semiconductor substrate includes a space formed by the surface of the nitride semiconductor layer immediately above each recess having the above structure and the each recess.

Embodiments

Hereinafter, embodiments of the present invention will be described. However, the invention is not limited to the embodiments given below. While in the following embodiments, technologically preferable limitations are given to implement the present invention, the limitations are not essential requirements of the present invention.

Note that, in the drawings used in the following description, dimensional relationships between illustrated respective portions may be different from actual dimensional relationships thereof.

<Nitride Semiconductor Substrate>

As illustrated in FIG. 1, a nitride semiconductor substrate 1 of the present embodiment includes a sapphire substrate 2 and a nitride semiconductor layer 3 formed on the sapphire substrate 2. The nitride semiconductor layer 3 is a nitride semiconductor layer containing a group III element including Al and nitrogen as a main component.

A main surface 21 of the sapphire substrate 2 where the nitride semiconductor layer 3 is formed includes recesses 211 having a maximum opening size of from 2 nm to 60 nm in an amount of from $1 \times 10^9$ pieces to $1 \times 10^{11}$ pieces per $cm^2$, and preferably in an amount of from $3 \times 10^9$ $cm^{-2}$ to $1 \times 10^{11}$ $cm^{-2}$.

The nitride semiconductor substrate 1 includes a space 4 formed by each of the recesses 211 and a surface 311 of the nitride semiconductor layer 3 immediately above the each recess 211. Of a surface 31 of the nitride semiconductor layer 3 on the sapphire substrate side, a height difference ΔH between the surface 311 immediately above each recess 211 and a surface 312 in contact with a flat surface 212 is 10 nm or less.

A portion 32 of the nitride semiconductor layer 3 above each recess 211 has a crystalline structure produced by growth along a polar plane of the group III element including Al.

<Method for Manufacturing Nitride Semiconductor Substrate>

Figure 2A:
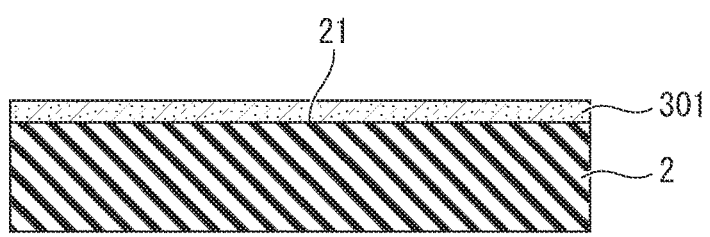
FIGS. 2A to 2C are cross-sectional views describing a method for manufacturing the nitride semiconductor substrate of the embodiment.

A method for manufacturing the nitride semiconductor substrate of the embodiment will be described with reference to FIGS. 2A to 2C.

First, a recess forming film 301 containing, as a main component, a nitride semiconductor including the group III element including Al and nitrogen and having a thickness of from 0.1 nm to 2 nm is formed on the substantially flat main surface 21 of the sapphire substrate 2 by metal organic chemical vapor deposition method (MOCVD method) (first step). FIG. 2A illustrates the state. As the recess forming film 301, for example, a film of at least any one of AlN, GaN, and InN or a film of a mixed crystal thereof is formed in a range of from 500° C. to 900° C.

Next, the sapphire substrate 2 after the first step is annealed at a temperature of from 1100° C. to 1250° C. (second step). As a result, through holes 301a are formed in the recess forming film 301, whereby the recesses 211 are formed on the main surface 21 of the sapphire substrate 2. FIG. 2B illustrates the state. The recesses 211 have a maximum opening size of from 2 nm to 60 nm, and are formed in an amount of from $1 \times 10^9$ pieces to $1 \times 10^{11}$ pieces per $cm^2$. The time of annealing at the second step is preferably set to be within a range of from 600 seconds to 1200 seconds.

Note that when conditions of the first step and the second step are set to, for example, those as below, the recesses 211 having a maximum opening size of from 2 nm to 60 nm can be formed in an amount of from $3 \times 10^9$ pieces to $1 \times 10^{11}$ pieces per $cm^2$ on the main surface 21 of the sapphire substrate 2.

As the recess forming film 301, for example, the film of at least anyone of AlN, GaN, and InN or the film of a mixed crystal thereof is formed in a range of from 500° C. to 1050° C. The temperature of annealing at the second step is set to be from 1100° C. to 1350° C., and preferably from 1200° C. to 1300° C. The annealing time at the second step is set to be within a range of from 600 seconds to 1800 seconds.

Figure 2B:
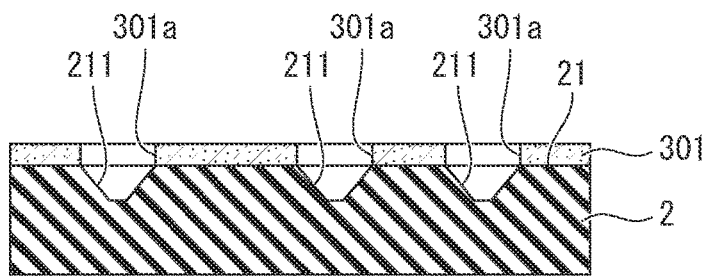
Figure 2C:
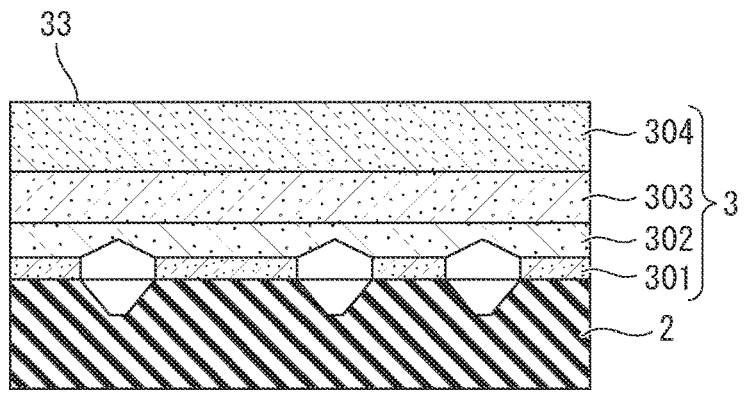

Next, on the recess forming film 301 of the sapphire substrate 2 in the state of FIG. 2B is formed a nitride semiconductor layer containing a group III element including Al and nitrogen as a main component (third step). At the third step of the present embodiment, as illustrated in FIG. 2C, an initial layer 302, a first layer 303, and a second layer 304 are formed in this order, as the nitride semiconductor layer 3. As a result, the nitride semiconductor substrate 1 illustrated in FIG. 1 can be obtained.

The initial layer 302 is formed by MOCVD method while keeping a surface temperature of the sapphire substrate 2 at a range of from 800° C. to 900° C. When forming AlN layer as the initial layer 302, the initial layer 302 has a film thickness of preferably from 0.5 nm to 10 nm.

The first layer 303 is formed by MOCVD method, and the surface temperature in that case is set to be within a range of, for example, from 1200° C. to 1350° C. The first layer 303 has a film thickness of preferably from 50 nm to 200 nm.

The second layer 304 is formed by MOCVD method, and the surface temperature in that case is set to be within a range of, for example, from 1050° C. to 1150° C. or from 1000° C. to 1150° C. The second layer 304 has a film thickness of preferably from 1500 nm to 4500 nm or from 1500 nm to 5000 nm.

Note that it is not essential to form the initial layer 302.

In the above respective steps, for example, trimethyl aluminum (TMAl) can be used as an Al raw material. For example, trimethyl gallium (TMGa) can be used as a Ga raw material. For example, ammonia ($NH_3$) can be used as an N raw material. For example, trimethyl indium (TMIn) can be used as an In raw material.

By performing the above respective steps, there can be obtained a nitride semiconductor substrate 1 where on the sapphire substrate 2 is formed the nitride semiconductor layer 3 including the first layer 303 and the second layer 304 in which the second layer 304 has a lower dislocation density than that of the first layer 303.

According to the method of the embodiment, implementing the method of the second aspect of the present invention enables formation of the nitride semiconductor layer 3 excellent in flatness of the surface (the surface on the side opposite to the sapphire substrate) 33 at the third step. As a result, as illustrated in FIG. 1, there is obtained the nitride semiconductor substrate 1 where the nitride semiconductor layer 3 excellent in crystallinity and a flatness of the surface 33 is formed on the sapphire substrate 2.

Hereinafter, a description will be given of constituent elements of the nitride semiconductor substrate, an ultraviolet light emitting element, and devices including the device.

<Sapphire Substrate>

The sapphire substrate includes the recesses having a maximum opening size of from 2 nm to 60 nm and a distribution density of from $1\times10^9$ cm$^{-2}$ to $1\times10^{11}$ cm$^{-2}$ and a flat portion on the main surface thereof. The distribution density of the recesses is preferably from $3\times10^9$ cm$^{-2}$ to $1\times10^{11}$ cm$^{-2}$, more preferably from $7\times10^9$ cm$^{-2}$ to $1\times10^{11}$ cm$^{-2}$, and still more preferably from $1\times10^{10}$ cm$^{-2}$ to $1\times10^{11}$ cm$^{-2}$.

Herein, the recesses refer to a plurality of recessed portions that are formed on the main surface of the sapphire substrate and recessed from the main surface. Additionally, an inside of each of the recesses is hollow, and a space is formed in an interface with the nitride semiconductor layer. In addition, the flat portion refers to a flat portion of the main surface of the sapphire substrate.

Furthermore, the maximum opening size of the recesses is defined as a maximum length of a straight line that can be drawn inside an opening at an opening end of each recess. For example, when the opening end of the recess is circular, the diameter of the circle corresponds to the maximum opening size of the recess. Alternatively, when the recess has a polygonal opening end, a maximum length of diagonal lines of the polygon corresponds to the maximum opening size of the recess.

The presence or absence of the recesses, the maximum opening size of the recesses, and the distribution density of the recesses can be observed or measured by observing the main surface of the sapphire substrate through a cross-sectional transmission electron microscope (TEM) or a planar TEM.

Note that, in this case, a length of each recess extending in a horizontal direction of the recess present in a cross-section, i.e., in a direction parallel to the main surface of the sapphire substrate is defined as the maximum opening size of the recess.

Additionally, in this case, regarding the distribution density, an average of values obtained by dividing the numbers of pieces of recesses observed through planar TEM measurement by measurement areas, or an average of values of five cross sections obtained by regarding, as a distribution density, a value indicating a higher density out of values obtained by dividing the number of pieces of recesses in a cross section through cross-sectional TEM measurement by each of measurement range and measurement sample depth length is defined as the distribution density of the recesses of the sapphire substrate.

Additionally, the depth of the recesses is preferably from 5 nm to 50 nm. In this manner, when forming a nitride semiconductor layer on the main surface of the sapphire substrate, the degree of concentration of dislocations to the nitride semiconductor layer portion formed at the initial stage is further increased, thereby further improving crystallinity of the nitride semiconductor layer portions formed after that. Herein, the depth of the recesses refers to a maximum depth in a direction perpendicular to a surface including the opening end of each of the recesses. The depth of the recesses can be measured by cross-sectional transmission electron microscope (TEM) mentioned above.

In addition, a maximum size (T) of bottom surfaces of the recesses is preferably equal to or less than $1/10$ of a maximum opening size (K) of the recesses, i.e., $T/K \leq 0.1$.

In this manner, when forming the nitride semiconductor layer on the main surface of the sapphire substrate, the degree of concentration of dislocations to the nitride semiconductor layer portion formed at the initial stage is further increased, thereby further improving crystallinity of the nitride semiconductor layer portions formed after that.

Herein, the bottom surfaces of the recesses refer to surfaces that are located at deepest positions from the opening ends of the recesses and that are substantially perpendicular to the main surface of the sapphire substrate. Additionally, like the maximum opening size of the recesses, the maximum size of the bottom surfaces is defined as the maximum length of a straight line that can be drawn inside the bottom surfaces. When there is no surface parallel to the main surface of the sapphire substrate at the deepest position from the opening end of any recess, i.e., such as, for example, when the recess has a sharp leading end or when the recess has a bottom surface inclined to the main surface of the sapphire substrate, the maximum size of the bottom surface is regarded as zero.

<Nitride Semiconductor Layer>

The nitride semiconductor layer is a layer formed on the main surface of the above-described sapphire substrate and including Al. Additionally, the portion of the nitride semiconductor layer above each of the recesses of the sapphire substrate has the crystalline structure (hereinafter may be referred to as "portion of the group III polar plane" or "group III polar plane") produced by growth along the polar plane of a group III element, and, of the surface of the nitride semiconductor layer on the sapphire substrate side, the height difference between the surface immediately above each recess and the surface in contact with the flat portion surface is 10 nm or less.

Herein, a method for confirming whether the portions of the nitride semiconductor layer above the recesses are the group III polar plane is as follows.

First, the nitride semiconductor substrate is immersed for 10 minutes in 50% by weight KOH solution heated to 80° C. After that, the surface of the nitride semiconductor layer of the nitride semiconductor substrate taken out from the KOH solution is observed through a scanning electron microscope (SEM) or an atomic force microscope (AFM), and a cross section of the nitride semiconductor substrate is observed through a cross-sectional transmission electron microscope (TEM).

The portion of a group V polar plane in a nitride semiconductor layer has a faster etching rate in KOH solution than the portion of a group III polar plane. Thus, when the nitride semiconductor substrate is immersed in KOH solution, the portion of the group V polar plane in the nitride semiconductor layer is largely etched.

The polar plane of a nitride semiconductor layer is a group III polar plane or a group V polar plane. Due to this, by observing the surface of the nitride semiconductor layer under the above conditions, it is possible to confirm that a portion not etched by the KOH solution is the portion of the group III polar plane of the nitride semiconductor layer.

Then, by observing the cross section of the nitride semiconductor substrate through a cross-sectional transmission electron microscope (TEM), it is possible to confirm that the portions of the sapphire substrate above the recesses in the nitride semiconductor layer are the portions of the group III polar plane. Herein, the five cross sections are observed, and when 90% or more of the portions above the recesses are those of the group III polar plane, it is defined as "the portions above the recesses in the nitride semiconductor layer are the portions of the group III polar plane".

In addition, when a layer other than the nitride semiconductor layer is formed on the surface (the surface on the side opposite to the sapphire substrate) of the nitride semiconductor substrate, the surface is physically grounded and polished to expose the nitride semiconductor layer, thereby enabling the above determination with KOH solution.

Additionally, by observation through a cross-sectional transmission electron microscope (TEM), it is possible to confirm that "of the surface of the nitride semiconductor layer on the sapphire substrate side, the height difference between the surface immediately above each of the recesses and the flat surface" is 10 nm or less.

Herein, regarding the cross section of the nitride semiconductor substrate, the five cross sections are used to observe, "of the surface of the nitride semiconductor layer on the sapphire substrate side, the height difference between the surface immediately above each of the recesses and the surface in contact with the flat surface", and an average value thereof is defined as, "of the surface of the nitride semiconductor layer on the sapphire substrate side, the height difference between the surface immediately above each of the recesses and the surface in contact with the flat surface".

The material of the nitride semiconductor layer is not particularly limited as long as the material is a compound composed of a group III element including Al and nitrogen, and examples of the compound include AlN, AlGaN, and AlInN.

It is possible to confirm that the nitride semiconductor layer includes Al through X-ray fluorescence elemental analysis (XRF), Rutherford backscattering spectrometry (RBS), secondary ion mass spectrometry SIMS, and X-ray photoelectron spectroscopy (XPS).

As an Al raw material, for example, trimethyl aluminum (TMAl) can be used. As a Ga raw material, for example, trimethyl gallium (TMGa) or triethyl gallium (TEGa) can be used. Additionally, as an N raw material, for example, ammonia (NH3) can be used. As an In raw material, for example, trimethyl indium (TMIn) can be used.

In addition, the nitride semiconductor layer preferably has a crystallinity of from 45 arcsec to 70 arcsec on (0002) plane and a crystallinity of from 240 arcsec to 290 arcsec on (10-12) plane. In this manner, it is possible to improve the crystallinity of a layer formed on the nitride semiconductor layer. Herein, the crystallinity of the nitride semiconductor layer can be evaluated by X-ray rocking curve method ($\omega$ scan).

Additionally, the surface of the nitride semiconductor layer has a root mean square roughness (Rq) of preferably from 0.15 nm to 1 nm. In this manner, it is possible to improve the crystallinity of a layer formed on the nitride semiconductor layer. Herein, the root mean square roughness (Rq) of the surface of the nitride semiconductor layer can be measured by using an atomic force microscope (AFM). The measurement range of the AFM is set to, for example, a 4 μm square.

In addition, the portion of the nitride semiconductor layer on the flat portion is preferably a portion of the group III polar plane. In this manner, the surface flatness of the nitride semiconductor layer can be further improved.

<Ultraviolet Light Emitting Element>

An ultraviolet light emitting element of the present embodiment includes the nitride semiconductor substrate of the embodiment described above.

The ultraviolet light emitting element of the present embodiment includes the nitride semiconductor substrate in which the main component of the nitride semiconductor layer is AlN and a nitride semiconductor laminated portion that is a nitride semiconductor laminated portion formed on the nitride semiconductor layer and including an n-type nitride semiconductor layer, a light emitting layer, and a p-type nitride semiconductor layer in this order from the nitride semiconductor layer side.

Since the nitride semiconductor layer is the AlN layer formed on the sapphire substrate according to the present embodiment, the nitride semiconductor laminated portion having favorable crystallinity can be formed on the nitride semiconductor layer. Accordingly, by using the nitride semiconductor substrate of the present invention, there can be obtained an ultraviolet light emitting element having excellent light emission efficiency. One example of a method for forming the nitride semiconductor laminated portion can be use of metal organic chemical vapor deposition method (MOCVD method).

<Ultraviolet Light Emitting Device>

The ultraviolet light emitting element of the present embodiment is applicable to various kinds of devices. For example, it is applicable to all existing devices using an ultraviolet lamp, and can be a replacement for the ultraviolet lamp being used. Particularly, the ultraviolet light emitting element is applicable to devices using deep ultraviolet light with a wavelength of 300 nm or less.

In addition, applicable examples thereof include those of medical and life science fields, environmental fields, industry and manufacturing fields, living and home appliance fields, agricultural fields, and other fields.

Furthermore, applicable examples thereof include devices for synthesis and decomposition of drugs and chemicals, sterilizers for liquids, gasses, and solids (such as containers, food, and medical instruments), cleaning devices for semiconductors and the like, surface modification devices for films, glass, metals, and the like, exposure devices for manufacturing semiconductors, flat panel displays (FPDs), printed circuit boards (PCBs), and other electronic products, printing and coating devices, adhesion and sealing devices, transfer molding devices for films, patterns, mockups, and the like, measurement and testing devices for banknotes, scratches, blood, chemical substances, and the like.

Examples of liquid sterilizers include water supply tanks for an automatic ice maker and an ice tray in refrigerators, ice storage containers, and ice making machines, freezers, ice making machines, humidifiers, dehumidifiers, a cold water tank, a hot water tank, and a flow path pipe of water servers, stationary water purifiers, portable water purifiers, water supply systems, hot water supply systems, waste water treatment devices, disposers, drainage traps for toilet bowls, washing machines, water sterilization modules for dialysis, connector sterilizers for peritoneal dialysis, and water storage systems for disasters, but are not limited thereto.

Examples of gas sterilizers include air purifiers, air conditioners, ceiling fans, cleaners for floors and bedding, futon dryers, shoe dryers, washing machines, clothes dryers, indoor germicidal lamps, ventilation systems for storage warehouses, shoeboxes, and wardrobes, but are not limited thereto.

Examples of solid sterilizers (including surface sterilizers) include vacuum packing devices, belt conveyors, hand tool sterilizers for medical treatment, dental treatment, barber shops, and beauty salons, toothbrushes, toothbrush containers, chopstick cases, cosmetic bags, drain covers, private-part washers for toilet bowls, and toilet bowl covers, but are not limited thereto.

<Ultraviolet Light Receiving Element>

An ultraviolet light receiving element of the present embodiment includes the nitride semiconductor substrate of the above-described embodiment.

The ultraviolet light receiving element of the present embodiment includes the nitride semiconductor substrate where the main component of the nitride semiconductor layer is AlN, a first nitride semiconductor layer formed on the nitride semiconductor layer and including Al and Ga, a second nitride semiconductor layer formed on the first nitride semiconductor layer and including Al and Ga, in which the second nitride semiconductor layer has an Al content higher than the Al content of the first nitride semiconductor layer, and an electrode pair formed on the second nitride semiconductor layer.

Since the nitride semiconductor layer is the AlN layer formed on the sapphire substrate according to the present embodiment, the first and second nitride semiconductor layers having favorable crystallinity can be formed on the nitride semiconductor layer. Accordingly, with the use of the nitride semiconductor substrate of the present invention, there can be obtained the ultraviolet light receiving element having excellent light receiving efficiency. One example of a method for forming the first and second nitride semiconductor layers can be use of a metal organic chemical vapor deposition method (MOCVD method).

<Ultraviolet Light Receiving Device>

The ultraviolet light receiving element of the present embodiment is applicable to various kinds of devices. For example, it is applicable to all existing devices using an ultraviolet sensor, and can be a replacement for the ultraviolet sensor being used. Particularly, the ultraviolet light receiving element is applicable to devices using deep ultraviolet light with a wavelength of 300 nm or less.

Application examples thereof include flame sensors, nitric oxide sensors, ozone sensors, and urea sensors, but are not limited thereto.

EXAMPLES

Hereinafter, a description will be given of Examples and Comparative Examples of the nitride semiconductor substrate of the present invention.

Example 1

A nitride semiconductor substrate was produced in the following manner.

First, a film of an AlN layer (a recess forming film) having a thickness of 0.3 nm was formed on a substantially flat main surface of a sapphire substrate by a metal organic chemical vapor deposition method (MOCVD method). In this case, the sapphire substrate had a surface temperature of 800° C.

Next, the sapphire substrate including the film of the AlN layer (the recess forming film) formed thereon was annealed at 1100° C. for 10 minutes to form recesses having a maximum opening size of from 2 nm to 60 nm on the main surface of the substrate. Measurement performed through cross-sectional TEM showed that the recesses had a distribution density of $3 \times 10^{10}$ cm$^{-2}$.

Next, while keeping the surface temperature of the sapphire substrate at 850° C., a film of an AlN layer (initial layer) having a thickness of 3 nm was formed on the recess forming film (the AlN layer) of the sapphire substrate by MOCVD method.

Next, while keeping the surface temperature of the sapphire substrate at 1250° C., a film of an AlN layer (first layer) having a thickness of 100 nm was formed on the AlN layer (initial layer) by MOCVD method.

Next, while keeping the surface temperature of the sapphire substrate at 1100° C., a film of an AlN layer (second layer) having a thickness of 3500 nm was formed on the AlN layer (first layer) by MOCVD method.

In the formation of the films by MOCVD, trimethyl aluminum (TMAl) was used as an Al raw material, and ammonia (NH$_3$) was used as an N raw material.

In the obtained nitride semiconductor substrate, AlN layer crystallinity was evaluated by X-ray rocking curve method ($\omega$ scan) to obtain FWHM=50 arcsec on (0002) plane and FWHM=250 arcsec on (10-12) plane. The evaluation was performed by using a fully automated horizontal multipurpose X-ray diffractometer "SmartLab", manufactured by Rigaku Corporation.

In addition, measurement through AFM showed that the surface (AlN layer) of the obtained nitride semiconductor substrate had a root mean square roughness (Rq) of 0.5 nm. The measurement used "Nanocute" manufactured by SII Nano Technology Inc., as the AFM, in which a 4 µm square was set as the measurement range, and the AFM was operated in the noncontact mode.

Additionally, the surface (AlN layer) of the obtained nitride semiconductor substrate was immersed for 10 minutes in a KOH solution (50% by weight) at 80° C., and then was observed through cross-sectional TEM. The results confirmed that the AlN layer immediately above the recesses was hardly etched, and portions of the AlN layer immediately above the recesses were crystal-grown along an Al polar plane (group III polar plane). Furthermore, portions of the AlN layer immediately on the flat portion were also confirmed to have been crystal-grown along the Al polar plane (group III polar plane).

In addition, cross-sectional TEM observation showed that ΔH (of a surface of the AlN layer on the sapphire substrate side, the height difference between a surface immediately above each of the recesses and a surface in contact with the flat surface) was 3.0 nm.

Example 2

A nitride semiconductor substrate was produced in the same manner as Example 1 described above, except that the recess forming film had a film thickness of 4 nm.

Measurement through cross-sectional TEM was performed on the sapphire substrate with the recess forming film (AlN layer) formed thereon, and showed that the distribution density of the recesses was $5 \times 10^{10}$ cm$^{-2}$.

In the obtained nitride semiconductor substrate, AlN layer crystallinity was evaluated by X-ray rocking curve method ($\omega$ scan) to obtain FWHM=60 arcsec on (0002) plane and FWHM=270 arcsec on (10-12) plane.

In addition, measurement through AFM showed that the surface (AlN layer) of the obtained nitride semiconductor substrate had a root mean square roughness (Rq) of 0.5 nm.

Additionally, the surface (AlN layer) of the obtained nitride semiconductor substrate was immersed for 10 minutes in a KOH solution (50% by weight) at 80° C., and then was observed through cross-sectional TEM. The results confirmed that the AlN layer immediately above the recesses was hardly etched, and the portions of the AlN layer immediately above the recesses were crystal-grown along an Al polar plane (group III polar plane). Furthermore, portions of the AlN layer immediately on the flat portion were also confirmed to have been crystal-grown along the Al polar plane (group III polar plane).

In addition, cross-sectional TEM observation showed that ΔH (of a surface of the AlN layer on the sapphire substrate side, a height difference between a surface immediately above each of the recesses and a surface in contact with the flat surface) was 3.0 nm.

Example 3

A nitride semiconductor substrate was produced in the same manner as Example 1 described above, except that the recess forming film had a film thickness of 10 nm.

Measurement through cross-sectional TEM was performed on the sapphire substrate with the recess forming film (AlN layer) formed thereon, and showed that the distribution density of the recesses was $8 \times 10^{10}$ cm$^{-2}$.

In the obtained nitride semiconductor substrate, AlN layer crystallinity was evaluated by X-ray rocking curve method (ω scan) to obtain FWHM=70 arcsec on (0002) plane and FWHM=290 arcsec on (10-12) plane.

In addition, measurement through AFM showed that the surface (AlN layer) of the obtained nitride semiconductor substrate had a root mean square roughness (Rq) of 0.8 nm.

Additionally, the surface (AlN layer) of the obtained nitride semiconductor substrate was immersed for 10 minutes in a KOH solution (50% by weight) at 80° C., and then was observed through cross-sectional TEM. The results confirmed that the AlN layer immediately above the recesses was hardly etched, and portions of the AlN layer immediately above the recesses were crystal-grown along an Al polar plane (group III polar plane). Furthermore, portions of the AlN layer immediately on the flat portion were also confirmed to have been crystal-grown along the Al polar plane (group III polar plane).

In addition, cross-sectional TEM observation showed that ΔH (of a surface of the AlN layer on the sapphire substrate side, a height difference between a surface immediately above each of the recesses and a surface in contact with the flat surface) was 3.5 nm.

Example 4

A nitride semiconductor substrate was produced in the same manner as Example 1 described above, except that the annealing time was 20 minutes.

Measurement through cross-sectional TEM was performed on the sapphire substrate with the recess forming film (AlN layer) formed thereon, and showed that the distribution density of the recesses was $3 \times 10^{10}$ cm$^2$.

In the obtained nitride semiconductor substrate, AlN layer crystallinity was evaluated by X-ray rocking curve method (ω scan) to obtain FWHM=45 arcsec on (0002) plane and FWHM=245 arcsec on (10-12) plane.

In addition, measurement through AFM showed that the root mean square roughness (Rq) of the surface (AlN layer) of the obtained nitride semiconductor substrate was 0.3 nm.

Additionally, the surface (AlN layer) of the obtained nitride semiconductor substrate was immersed for 10 minutes in a KOH solution (50% by weight) at 80° C., and then was observed through cross-sectional TEM. The results confirmed that the AlN layer immediately above the recesses was hardly etched, and portions of the AlN layer immediately above the recesses were crystal-grown along an Al polar plane (group III polar plane). Furthermore, portions of the AlN layer immediately on the flat portion were also confirmed to have been crystal-grown along the Al polar plane (group III polar plane).

In addition, cross-sectional TEM observation showed that ΔH (of a surface of the AlN layer on the sapphire substrate side, a height difference between a surface immediately above each of the recesses and a surface in contact with the flat surface) was 2.5 nm.

Example 5

A nitride semiconductor substrate was produced in the same manner as Example 1 described above, except that the annealing time was 5 minutes.

Measurement through cross-sectional TEM was performed on the sapphire substrate with the recess forming film (AlN layer) formed thereon, and showed that the distribution density of the recesses was $3 \times 10^{10}$ cm$^{-2}$.

In the obtained nitride semiconductor substrate, AlN layer crystallinity was evaluated by X-ray rocking curve method (ω scan) to obtain FWHM=45 arcsec on (0002) plane and FWHM=240 arcsec on (10-12) plane.

In addition, measurement through AFM showed that the root mean square roughness (Rq) of the surface (AlN layer) of the obtained nitride semiconductor substrate was 0.2 nm.

Additionally, the surface (AlN layer) of the obtained nitride semiconductor substrate was immersed for 10 minutes in a KOH solution (50% by weight) at 80° C., and then was observed through cross-sectional TEM. The results confirmed that the AlN layer immediately above the recesses was hardly etched, and portions of the AlN layer immediately above the recesses were crystal-grown along an Al polar plane (group III polar plane). Furthermore, portions of the AlN layer immediately on the flat portion were also confirmed to have been crystal-grown along the Al polar plane (group III polar plane).

In addition, cross-sectional TEM observation showed that ΔH (of a surface of the AlN layer on the sapphire substrate side, a height difference between a surface immediately above each of the recesses and a surface in contact with the flat surface) was 3.0 nm.

Comparative Example 1

A nitride semiconductor substrate was produced in the same manner as Example 1 described above, except that no recess forming film was formed.

Measurement through cross-sectional TEM performed on the obtained nitride semiconductor substrate showed that there was no recess at an interface between the sapphire substrate and the AlN layer.

In the obtained nitride semiconductor substrate, AlN layer crystallinity was evaluated by X-ray rocking curve method (ω scan) to obtain FWHM=350 arcsec on (0002) plane and FWHM=850 arcsec on (10-12) plane.

In addition, measurement through AFM showed that the surface (AlN layer) of the obtained nitride semiconductor had a root mean square roughness (Rq) of 3.3 nm.

Comparative Example 2

A nitride semiconductor substrate was produced in the same manner as Example 1 described above, except that the annealing time was 2 minutes.

Measurement through cross-sectional TEM was performed on the sapphire substrate with the recess forming film (AlN layer) formed thereon, and showed that the distribution density of the recesses was $4 \times 10^7$ cm$^{-2}$.

AlN layer crystallinity was evaluated by X-ray rocking curve method (ω scan) to obtain FWHM=280 arcsec on (0002) plane and FWHM=700 arcsec on (10-12) plane. In addition, measurement through AFM showed that the root mean square roughness (Rq) of the surface (AlN layer) of the obtained nitride semiconductor was 2.3 nm.

Additionally, the surface (AlN layer) of the obtained nitride semiconductor substrate was immersed for 10 minutes in a KOH solution (50% by weight) at 80° C., and then was observed through cross-sectional TEM. The results confirmed that the AlN layer immediately above the recesses was hardly etched, and portions of the AlN layer immediately above the recesses were crystal-grown along an Al polar plane (group III polar plane). Furthermore, portions of the AlN layer immediately on the flat portion were also confirmed to have been crystal-grown along the Al polar plane (group III polar plane).

In addition, cross-sectional TEM observation showed that ΔH (of a surface of the AlN layer on the sapphire substrate side, a height difference between a surface immediately above each of the recesses and a surface in contact with the flat surface) was 3.0 nm.

Comparative Example 3

The sapphire substrate including recesses formed thereon was irradiated with NH$_3$ for 30 seconds while keeping the surface temperature of the sapphire substrate at 850° C., and then, a film of an AlN layer (initial layer) having a thickness of 3 nm was formed on the sapphire substrate by MOCVD method. Except for this, the same manner as Example 1 was adopted to produce a nitride semiconductor substrate.

Measurement through cross-sectional TEM was performed on the sapphire substrate with the recess forming film (AlN layer) formed thereon, and showed that the distribution density of the recesses was $3 \times 10^{10}$ cm$^{-2}$.

AlN layer crystallinity was evaluated by X-ray rocking curve method (ω scan) to obtain FWHM=235 arcsec on (0002) plane and FWHM=430 arcsec on (10-12) plane. In addition, measurement through AFM showed that the surface after the film formation had a root mean square roughness (Rq) of 3.1 nm.

Furthermore, the surface after the film formation was confirmed to have a plurality of hexagonal pillar-shaped structures. The AlN layer was immersed for 10 minutes in a KOH solution (50% by weight) at 80° C., followed by surface SEM observation, which confirmed that the above-mentioned hexagonal pillar portions were etched. Cross-sectional TEM observation confirmed that the hexagonally etched portions were formed immediately above the recesses, and portions of the AlN layer immediately above the recesses were crystal-grown along an N polar plane (group V polar plane).

In addition, cross-sectional TEM observation showed that ΔH (of a surface of the AlN layer on the sapphire substrate side, a height difference between a surface immediately above each of the recesses and a surface in contact with the flat surface) was 3.1 nm.

Comparative Example 4

A nitride semiconductor substrate was produced in the same manner as Example 1 described above, except that the formation temperature of the first layer was 1050° C.

Measurement through cross-sectional TEM was performed on the sapphire substrate with the recess forming film (AlN layer) formed thereon, and showed that the distribution density of the recesses was $3 \times 10^{10}$ cm$^{-2}$.

In the obtained nitride semiconductor substrate, AlN layer crystallinity was evaluated by X-ray rocking curve method (ω scan) to obtain FWHM=90 arcsec on (0002) plane and FWHM=330 arcsec on (10-12) plane.

In addition, measurement through AFM showed that the root mean square roughness (Rq) of the surface (AlN layer) of the obtained nitride semiconductor substrate was 2.2 nm.

The surface (AlN layer) of the obtained nitride semiconductor substrate was immersed for 10 minutes in a KOH solution (50% by weight) at 80° C., and then was observed through cross-sectional TEM. The results confirmed that the AlN layer immediately above the recesses was hardly etched, and portions of the AlN layer immediately above the recesses were crystal-grown along an Al polar plane (group III polar plane). Furthermore, portions of the AlN layer immediately on the flat portion were also confirmed to have been crystal-grown along the Al polar plane (group III polar plane).

In addition, cross-sectional TEM observation showed that ΔH (of a surface of the AlN layer on the sapphire substrate side, a height difference between a surface immediately above each of the recesses and a surface in contact with the flat surface) was 15.0 nm.

Comparative Example 5

A nitride semiconductor substrate was produced in the same manner as Example 1 described above, except that the formation temperature of the recess forming film was 750° C., the film thickness was 1.0 nm, and the annealing temperature was 1300° C.

Measurement through cross-sectional TEM was performed on the sapphire substrate with the recess forming film (AlN layer) formed thereon, and showed that the distribution density of the recesses was $3 \times 10^{12}$ cm$^{-2}$.

In the obtained nitride semiconductor substrate, AlN layer crystallinity was evaluated by X-ray rocking curve method (ω scan) to obtain FWHM=160 arcsec on (0002) plane and FWHM=520 arcsec on (10-12) plane.

In addition, measurement through AFM showed that the root mean square roughness (Rq) of the surface (AlN layer) of the obtained nitride semiconductor substrate was 3.5 nm.

Additionally, the surface (AlN layer) of the obtained nitride semiconductor substrate was immersed for 10 minutes in a KOH solution (50% by weight) at 80° C., and then was observed through cross-sectional TEM. The results confirmed that the AlN layer immediately above the recesses was hardly etched, and portions of the AlN layer immediately above the recesses were crystal-grown along an Al polar plane (group III polar plane). Furthermore, portions of the AlN layer immediately on the flat portion were also confirmed to have been crystal-grown along the Al polar plane (group III polar plane).

In addition, cross-sectional TEM observation showed that ΔH (of a surface of the AlN layer on the sapphire substrate side, a height difference between a surface immediately above each of the recesses and a surface in contact with the flat surface) was 2.5 nm.

Comparative Example 6

A nitride semiconductor substrate was produced in the same manner as Example 1 described above, except that the formation temperature of the recess forming film was 770° C., the film thickness was 0.7 nm, and the annealing temperature was 1300° C.

Measurement through cross-sectional TEM was performed on the sapphire substrate with the recess forming film (AlN layer) formed thereon, and showed that the distribution density of the recesses was $3 \times 10^{11}$ cm$^{-2}$.

In the obtained nitride semiconductor substrate, AlN layer crystallinity was evaluated by X-ray rocking curve method (ω scan) to obtain FWHM=140 arcsec on (0002) plane and FWHM=440 arcsec on (10-12) plane.

In addition, measurement through AFM showed that the root mean square roughness (Rq) of the surface (AlN layer) of the obtained nitride semiconductor substrate was 2.7 nm.

The surface (AlN layer) of the obtained nitride semiconductor substrate was immersed for 10 minutes in a KOH solution (50% by weight) at 80° C., and then was observed through cross-sectional TEM. The results confirmed that the AlN layer immediately above the recesses was hardly etched, and portions of the AlN layer immediately above the recesses were crystal-grown along an Al polar plane (group III polar plane). Furthermore, portions of the AlN layer immediately on the flat portion were also confirmed to have been crystal-grown along the Al polar plane (group III polar plane).

In addition, cross-sectional TEM observation showed that ΔH (of a surface of the AlN layer on the sapphire substrate side, a height difference between a surface immediately above each of the recesses and a surface in contact with the flat surface) was 3.5 nm.

Comparative Example 7

A nitride semiconductor substrate was produced in the same manner as Example 1 described above, except that the annealing temperature was 1050° C.

Measurement through cross-sectional TEM was performed on the sapphire substrate with the recess forming film (AlN layer) formed thereon, and showed that the distribution density of the recesses was $6 \times 10^{8}$ cm$^{2}$.

In the obtained nitride semiconductor substrate, AlN layer crystallinity was evaluated by X-ray rocking curve method (ω scan) to obtain FWHM=230 arcsec on (0002) plane and FWHM=610 arcsec on (10-12) plane.

In addition, measurement through AFM showed that the root mean square roughness (Rq) of the surface (AlN layer) of the obtained nitride semiconductor substrate was 2.5 nm.

Additionally, the surface (AlN layer) of the obtained nitride semiconductor substrate was immersed for 10 minutes in a KOH solution (50% by weight) at 80° C., and then was observed through cross-sectional TEM. The results confirmed that the AlN layer immediately above the recesses was hardly etched, and portions of the AlN layer immediately above the recesses were crystal-grown along an Al polar plane (group III polar plane). Furthermore, portions of the AlN layer immediately on the flat portion were also confirmed to have been crystal-grown along the Al polar plane (group III polar plane).

In addition, cross-sectional TEM observation showed that ΔH (of a surface of the AlN layer on the sapphire substrate side, a height difference between a surface immediately above each of the recesses and a surface in contact with the flat surface) was 3.0 nm.

The above results are summarized in Table 1. In Table 1, structures departing from the aspects of the present invention are underlined.

TABLE 1

| | Treatment on sapphire substrate | | | | | | | |
|---|---|---|---|---|---|---|---|---|
| | Recess forming film | | | Annealing | | Recesses | | |
| | Material | Temperature (° C.) | Film thickness (nm) | Temperature (° C.) | Time (min) | Depth (nm) | T/K | Density (pieces/cm$^2$) |
| Ex. 1 | ALN | 800 | 0.3 | 1100 | 10 | 30 | 0.1 | 3.00E+10 |
| Ex. 2 | ALN | 800 | 4.0 | 1100 | 10 | 35 | 1.0 | 5.00E+10 |
| Ex. 3 | ALN | 800 | 10.0 | 1100 | 10 | 50 | 2.0 | 8.00E+10 |
| Ex. 4 | ALN | 800 | 0.3 | 1100 | 20 | 30 | 0.5 | 3.00E+10 |
| Ex. 5 | ALN | 800 | 0.3 | 1100 | 5 | 5 | 1.5 | 3.00E+10 |
| Co. Ex. 1 | — | — | 0.0 | 1100 | 10 | 0 | 0.0 | 0 |
| Co. Ex. 2 | ALN | 800 | 0.3 | 1100 | 2 | 2 | 1.0 | 4.00E+07 |
| Co. Ex. 3 | ALN | 800 | 0.3 | 1100 | 10 | 30 | 0.1 | 3.00E+10 |
| Co. Ex. 4 | ALN | 800 | 0.3 | 1100 | 10 | 30 | 0.1 | 3.00E+10 |
| Co. Ex. 5 | ALN | 750 | 1.0 | 1300 | 10 | 15 | 0.1 | 3.00E+12 |
| Co. Ex. 6 | ALN | 770 | 0.7 | 1300 | 10 | 15 | 0.1 | 3.00E+11 |
| Co. Ex. 7 | ALN | 800 | 0.3 | 1050 | 15 | 20 | 20.0 | 6.00E+08 |

| | AlN layer | | | | | | | |
|---|---|---|---|---|---|---|---|---|
| | | Initial Layer | | First layer | | Second layer | | |
| | ΔH | Temperature | Film thickness | Temperature | Film thickness | Temperature | Film thickness | Crystallinity (arcsec) | Rq |

TABLE 1-continued

|  | (nm) | (° C.) | (nm) | (° C.) | (nm) | (° C.) | (nm) | (0002) | (10-12) | (nm) |
|---|---|---|---|---|---|---|---|---|---|---|
| Ex. 1 | 3.0 | 850 | 3 | 1250 | 100 | 1100 | 3500 | 50 | 250 | 0.5 |
| Ex. 2 | 3.0 | 850 | 3 | 1250 | 100 | 1100 | 3500 | 60 | 270 | 0.5 |
| Ex. 3 | 3.5 | 850 | 3 | 1250 | 100 | 1100 | 3500 | 70 | 290 | 0.8 |
| Ex. 4 | 2.5 | 850 | 3 | 1250 | 150 | 1100 | 3500 | 45 | 245 | 0.3 |
| Ex. 5 | 3.0 | 850 | 3 | 1250 | 200 | 1100 | 3500 | 45 | 240 | 0.2 |
| Co. Ex. 1 | 13.0 | 850 | 3 | 1250 | 100 | 1100 | 3500 | 350 | 850 | 3.3 |
| Co. Ex. 2 | 3.0 | 850 | 3 | 1250 | 100 | 1100 | 3500 | 280 | 700 | 2.3 |
| Co. Ex. 3 | 3.5 | 850 | 3 | 1250 | 100 | 1100 | 3500 | 235 | 430 | 3.1 |
| Co. Ex. 4 | 3.0 | 850 | 3 | 1050 | 100 | 1100 | 3500 | 90 | 330 | 2.2 |
| Co. Ex. 5 | 2.5 | 850 | 3 | 1250 | 100 | 1100 | 3500 | 160 | 520 | 3.5 |
| Co. Ex. 6 | 3.5 | 850 | 3 | 1250 | 100 | 1100 | 3500 | 140 | 440 | 2.7 |
| Co. Ex. 7 | 3.0 | 850 | 3 | 1250 | 100 | 1100 | 3500 | 230 | 610 | 2.5 |

Table 1 shows the following findings:

In the nitride semiconductor substrates of Examples 1 to 5, the AlN layer crystallinity is within a range of from 45 arcsec to 70 arcsec on the (0002) plane, and within a range of from 240 arcsec to 290 arcsec on the (10-12) plane. However, in the nitride semiconductor substrates of Comparative Examples 1 to 7, the AlN layer crystallinity is out of the ranges.

In the nitride semiconductor substrates of Examples 1 to 5, the root mean square roughness (Rq) of the surface (the surface of the nitride semiconductor layer on the side opposite to the sapphire substrate) is within a range of from 0.15 nm to 1 nm, whereas Rq in the nitride semiconductor substrates of Comparative Examples 1 to 7 is out of the range.

In other words, in each of the nitride semiconductor substrates of Examples 1 to 5, the nitride semiconductor layer excellent in crystallinity and surface flatness has been formed on the sapphire substrate.

REFERENCE SIGNS LIST

1: Nitride semiconductor substrate
2: Sapphire substrate
21: Surface of sapphire substrate where nitride semiconductor layer is formed
211: Recess
212: Flat surface
3: Nitride semiconductor layer
301: Recess forming film configured to form nitride semiconductor layer
302: Initial layer configured to form nitride semiconductor layer
303: First layer configured to form nitride semiconductor layer
304: Second layer configured to form nitride semiconductor layer
31: Surface of nitride semiconductor layer on sapphire substrate side
311: Surface immediately above recess
312: Surface in contact with flat surface
32: Portion of nitride semiconductor layer above recess
33: Surface of nitride semiconductor layer (surface on side opposite to sapphire substrate)
4: Space formed by recess and surface immediately above recess
ΔH: Height difference between surface immediately above recess and surface in contact with flat surface

The invention claimed is:

1. A nitride semiconductor substrate comprising:
a sapphire substrate; and
a nitride semiconductor layer formed on the sapphire substrate and containing a group III element including Al and nitrogen as a main component,
wherein a surface of the sapphire substrate where the nitride semiconductor layer is formed includes recesses having a maximum opening size of from 2 nm to 60 nm in an amount of from $1\times10^9$ pieces to $1\times10^{11}$ pieces per $cm^2$, in which a space is formed by each of the recesses and a surface of the nitride semiconductor layer immediately above each recess; of a surface of the nitride semiconductor layer on the sapphire substrate side, a height difference between the surface immediately above the each recess and a surface in contact with a flat surface is 10 nm or less; and a portion of the nitride semiconductor layer above the each recess has a crystalline structure produced by growth along a polar plane of the group III element.

2. The nitride semiconductor substrate according to claim 1, wherein the surface of the sapphire substrate where the nitride semiconductor layer is formed includes the recesses having a maximum opening size of from 2 nm to 60 nm in an amount of from $3\times10^9$ pieces to $1\times10^{11}$ pieces per $cm^2$.

3. The nitride semiconductor substrate according to claim 1, wherein a crystallinity of the nitride semiconductor layer is from 45 arcsec to 70 arcsec on (0002) plane, and is from 240 arcsec to 290 arcsec on (10-12) plane.

4. The nitride semiconductor substrate according to claim 1, wherein a surface of the nitride semiconductor layer on a side opposite to the sapphire substrate has a root mean square roughness (Rq) of from 0.15 nm to 1 nm.

5. The nitride semiconductor substrate according to claim 1, wherein portions of the nitride semiconductor layer on the flat surface have a crystalline structure produced by growth along the polar plane of the group III element.

6. The nitride semiconductor substrate according to claim 1, wherein a depth of the recesses is from 5 nm to 50 nm.

7. The nitride semiconductor substrate according to claim 1, wherein a maximum size of bottom surfaces of the recesses is equal to or less than 1/10 of the maximum opening size of the recesses.

8. An ultraviolet light emitting element comprising a nitride semiconductor substrate that is the nitride semiconductor substrate according to claim 1, in which the nitride semiconductor layer contains AlN as the main component; and a nitride semiconductor laminated portion formed on the nitride semiconductor layer, the nitride semiconductor laminated portion including an n-type nitride semiconductor layer, a light emitting layer, and a p-type nitride semiconductor layer in this order from the nitride semiconductor layer side.

9. An ultraviolet light emitting device comprising the ultraviolet light emitting element according to claim 8.

10. An ultraviolet light receiving element comprising:
a nitride semiconductor substrate that is the nitride semiconductor substrate according to claim 1, in which the nitride semiconductor layer contains AlN as the main component;
a first nitride semiconductor layer formed on the nitride semiconductor layer and including Al and Ga;
a second nitride semiconductor layer formed on the first nitride semiconductor layer and including Al and Ga, in which second nitride semiconductor layer has an Al content higher than the Al content of the first nitride semiconductor layer; and
an electrode pair formed on the second nitride semiconductor layer.

11. An ultraviolet light receiving device comprising the ultraviolet light receiving element according to claim 10.

12. A method for manufacturing a nitride semiconductor substrate comprising:
a first step of forming, on a sapphire substrate, a recess forming film having a thickness of from 0.1 nm to 10 nm and containing, as a main component, a nitride semiconductor including a group III element including Al and nitrogen;
a second step of forming through holes in the recess forming film by annealing the sapphire substrate after the first step at a temperature of from 1100° C. to 1350° C. to form recesses having a maximum opening size of from 2 nm to 60 nm in an amount of from $3 \times 10^9$ pieces to $1 \times 10^{11}$ pieces per cm$^2$ on a surface of the sapphire substrate where the recess forming film is formed; and
a third step of forming a nitride semiconductor layer containing a group III element including Al and nitrogen as a main component on the recess forming film of the sapphire substrate after the second step.

13. The nitride semiconductor substrate according to claim 2, wherein a crystallinity of the nitride semiconductor layer is from 45 arcsec to 70 arcsec on (0002) plane, and is from 240 arcsec to 290 arcsec on (10-12) plane.

14. The nitride semiconductor substrate according to claim 3, wherein a crystallinity of the nitride semiconductor layer is from 45 arcsec to 70 arcsec on (0002) plane, and is from 240 arcsec to 290 arcsec on (10-12) plane.

15. The nitride semiconductor substrate according to claim 2, wherein portions of the nitride semiconductor layer on the flat surface have a crystalline structure produced by growth along the polar plane of the group III element.

16. The nitride semiconductor substrate according to claim 2, wherein a depth of the recesses is from 5 nm to 50 nm.

17. The nitride semiconductor substrate according to claim 2, wherein a maximum size of bottom surfaces of the recesses is equal to or less than 1/10 of the maximum opening size of the recesses.

18. The nitride semiconductor substrate according to claim 5, wherein a depth of the recesses is from 5 nm to 50 nm.

19. The nitride semiconductor substrate according to claim 5, wherein a maximum size of bottom surfaces of the recesses is equal to or less than 1/10 of the maximum opening size of the recesses.

20. The nitride semiconductor substrate according to claim 6, wherein a maximum size of bottom surfaces of the recesses is equal to or less than 1/10 of the maximum opening size of the recesses.

* * * * *